(12) United States Patent
Huang et al.

(10) Patent No.: US 9,257,356 B2
(45) Date of Patent: Feb. 9, 2016

(54) SEMICONDUCTOR DEVICE AND METHOD OF FORMING AN IPD BENEATH A SEMICONDUCTOR DIE WITH DIRECT CONNECTION TO EXTERNAL DEVICES

(75) Inventors: Rui Huang, Singapore (SG); Heap Hoe Kuan, Singapore (SG); Yaojian Lin, Singapore (SG); Seng Guan Chow, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 1797 days.

(21) Appl. No.: 12/332,253

(22) Filed: Dec. 10, 2008

(65) Prior Publication Data

US 2010/0140780 A1 Jun. 10, 2010

(51) Int. Cl.
*H01L 49/02* (2006.01)
*H01L 23/31* (2006.01)
(Continued)

(52) U.S. Cl.
CPC .......... *H01L 23/3128* (2013.01); *H01L 21/561* (2013.01); *H01L 21/568* (2013.01); *H01L 23/495* (2013.01); *H01L 23/49506* (2013.01); *H01L 23/49541* (2013.01); *H01L 23/49816* (2013.01); *H01L 23/552* (2013.01); *H01L 23/66* (2013.01); *H01L 24/27* (2013.01); *H01L 24/29* (2013.01); *H01L 24/32* (2013.01); *H01L 24/49* (2013.01); *H01L 24/83* (2013.01); *H01L 24/97* (2013.01); *H01L 25/03* (2013.01); *H01L 25/0657* (2013.01); *H01L 25/105* (2013.01); *H01L 25/50* (2013.01); *H01L 24/48* (2013.01); *H01L 2224/16225* (2013.01); *H01L 2224/16235* (2013.01); *H01L 2224/27416* (2013.01); *H01L 2224/27436* (2013.01); *H01L 2224/2919* (2013.01); *H01L 2224/32225* (2013.01); *H01L 2224/48091* (2013.01); *H01L 2224/48227* (2013.01); *H01L 2224/48247* (2013.01); *H01L 2224/48465* (2013.01); *H01L 2224/4903* (2013.01); *H01L 2224/49051* (2013.01); *H01L 2224/73265* (2013.01); *H01L 2224/83136* (2013.01); *H01L 2224/83191* (2013.01); *H01L 2224/83192* (2013.01); *H01L 2224/83385* (2013.01); *H01L 2224/83856* (2013.01); (Continued)

(58) Field of Classification Search
CPC ................................. H01L 28/10; H01L 28/20
USPC .......................... 438/114, 118, 124, 126, 127; 257/E21.502
See application file for complete search history.

(56) References Cited

U.S. PATENT DOCUMENTS

2007/0171621 A1 7/2007 Chen
2008/0194058 A1* 8/2008 Kwon et al. .................. 438/108
(Continued)

*Primary Examiner* — Kevin Parendo
(74) *Attorney, Agent, or Firm* — Robert D. Atkins; Patent Law Group: Atkins and Associates, P.C.

(57) ABSTRACT

A semiconductor device has a conductive layer formed on a substrate. The conductive layer has a first portion constituting contact pads and a second portion constituting an integrated passive device such as an inductor. A spacer is formed on the substrate around the second portion of the conductive layer. The spacer can be insulating material or conductive material for shielding. A semiconductor die is mounted to the spacer. An electrical connection is formed between contact pads on the semiconductor die and the contact pads on the substrate. An encapsulant is formed around the semiconductor die, electrical connections, spacer, and conductive layer. The substrate is removed to expose the conductive layer. An interconnect structure is formed on the backside of the substrate. The interconnect structure is electrically connected to the conductive layer. The semiconductor device can be integrated into a package.

39 Claims, 11 Drawing Sheets

(51) Int. Cl.
   *H01L 21/56*   (2006.01)
   *H01L 23/495*  (2006.01)
   *H01L 23/498*  (2006.01)
   *H01L 23/552*  (2006.01)
   *H01L 23/66*   (2006.01)
   *H01L 23/00*   (2006.01)
   *H01L 25/065*  (2006.01)
   *H01L 25/10*   (2006.01)
   *H01L 25/00*   (2006.01)
   *H01L 25/03*   (2006.01)

(52) U.S. Cl.
   CPC ......... *H01L2224/92* (2013.01); *H01L 2224/97* (2013.01); *H01L 2225/0651* (2013.01); *H01L 2225/1023* (2013.01); *H01L 2225/1058* (2013.01); *H01L 2225/1088* (2013.01); *H01L 2924/00011* (2013.01); *H01L 2924/00014* (2013.01); *H01L 2924/0103* (2013.01); *H01L 2924/01004* (2013.01); *H01L 2924/014* (2013.01); *H01L 2924/01005* (2013.01); *H01L 2924/0105* (2013.01); *H01L 2924/01006* (2013.01); *H01L 2924/01013* (2013.01); *H01L 2924/01014* (2013.01); *H01L 2924/01023* (2013.01); *H01L 2924/01028* (2013.01); *H01L 2924/01029* (2013.01); *H01L 2924/01047* (2013.01); *H01L 2924/01073* (2013.01); *H01L 2924/01074* (2013.01); *H01L 2924/01078* (2013.01); *H01L 2924/01079* (2013.01); *H01L 2924/01082* (2013.01); *H01L 2924/01083* (2013.01); *H01L 2924/01322* (2013.01); *H01L 2924/04941* (2013.01); *H01L 2924/04953* (2013.01); *H01L 2924/0665* (2013.01); *H01L 2924/09701* (2013.01); *H01L 2924/12041* (2013.01); *H01L 2924/12044* (2013.01); *H01L 2924/1306* (2013.01); *H01L 2924/13091* (2013.01); *H01L 2924/14* (2013.01); *H01L 2924/1433* (2013.01); *H01L 2924/15311* (2013.01); *H01L 2924/181* (2013.01); *H01L 2924/1815* (2013.01); *H01L 2924/19015* (2013.01); *H01L 2924/19041* (2013.01); *H01L 2924/19042* (2013.01); *H01L 2924/19043* (2013.01); *H01L 2924/19103* (2013.01); *H01L 2924/19104* (2013.01); *H01L 2924/19107* (2013.01); *H01L 2924/3025* (2013.01); *H01L 2924/30105* (2013.01)

(56) References Cited

U.S. PATENT DOCUMENTS

| | | | |
|---|---|---|---|
| 2008/0315372 A1* | 12/2008 | Kuan et al. | 257/659 |
| 2009/0008765 A1* | 1/2009 | Yamano et al. | 257/690 |
| 2009/0102028 A1* | 4/2009 | Krishnan et al. | 257/666 |
| 2009/0267220 A1* | 10/2009 | Kuhlman et al. | 257/698 |

* cited by examiner

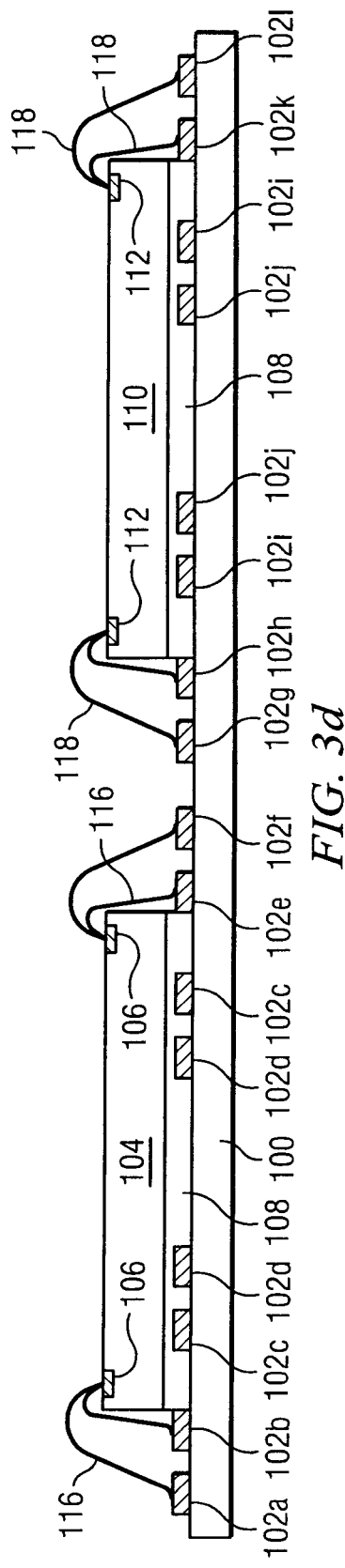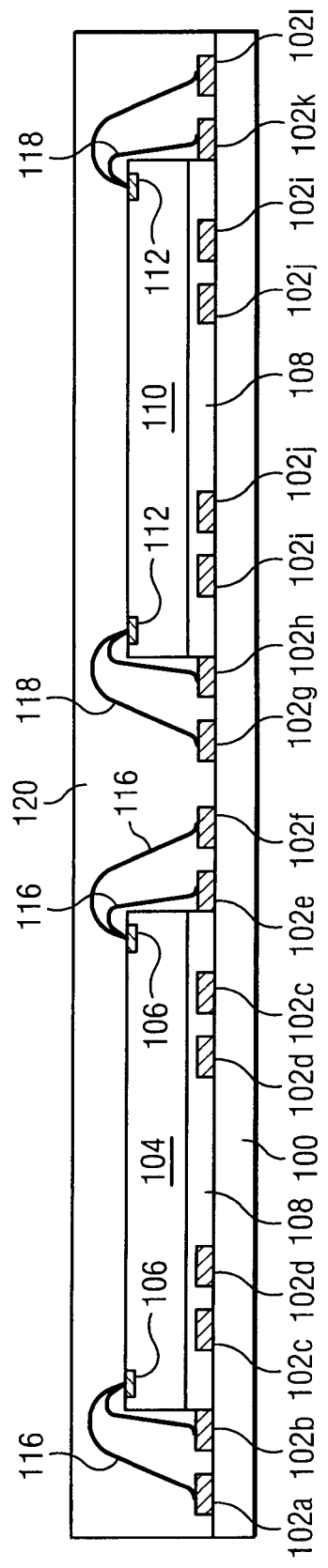

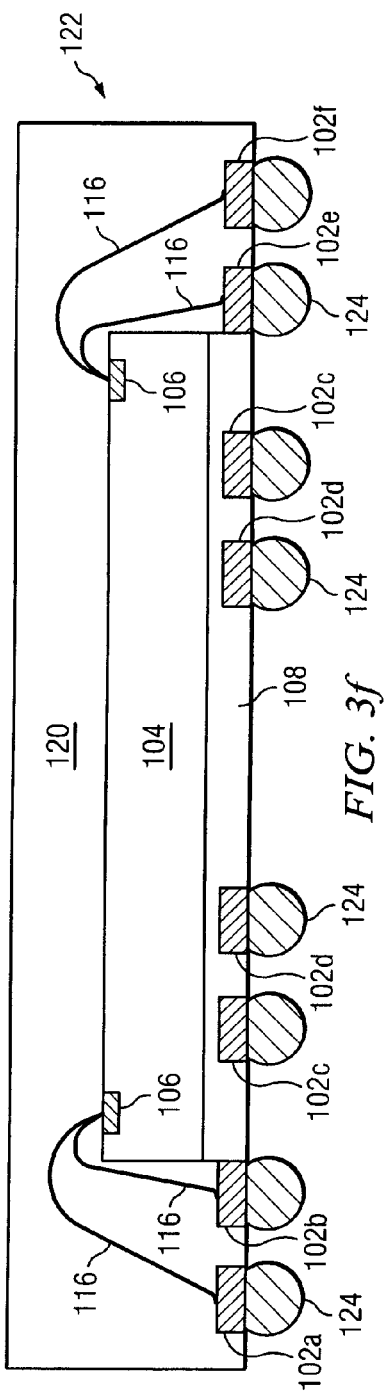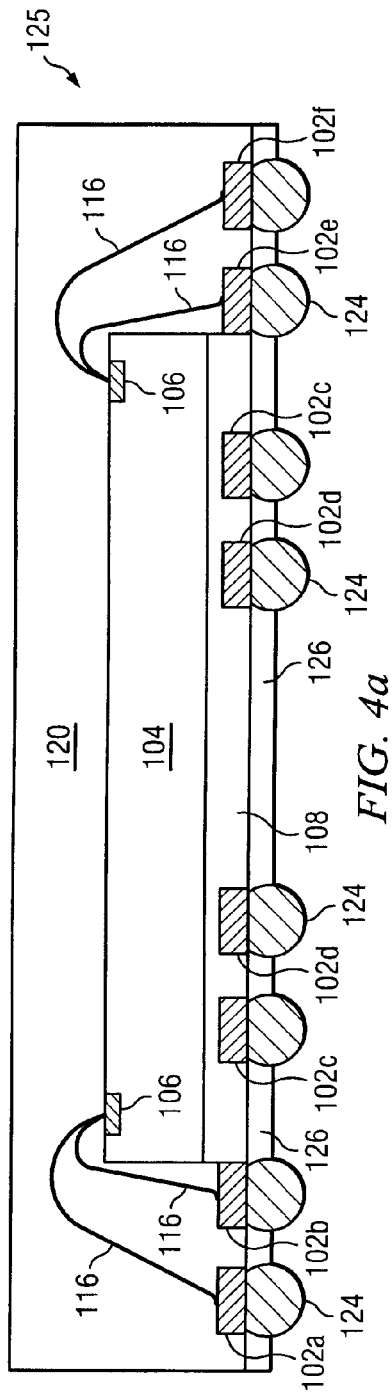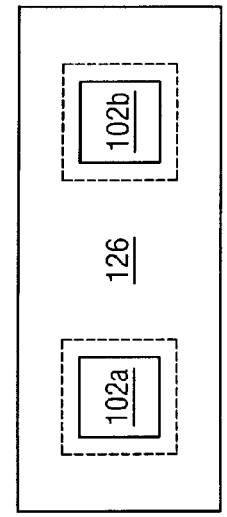

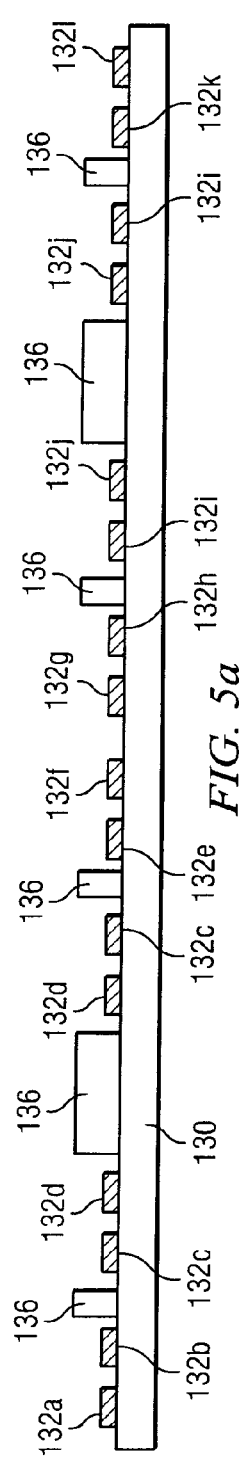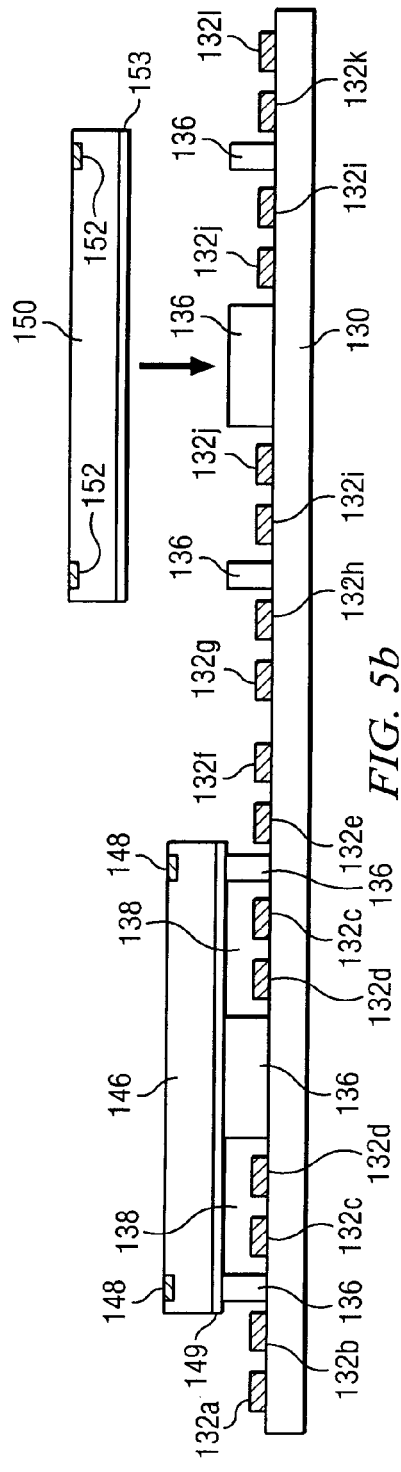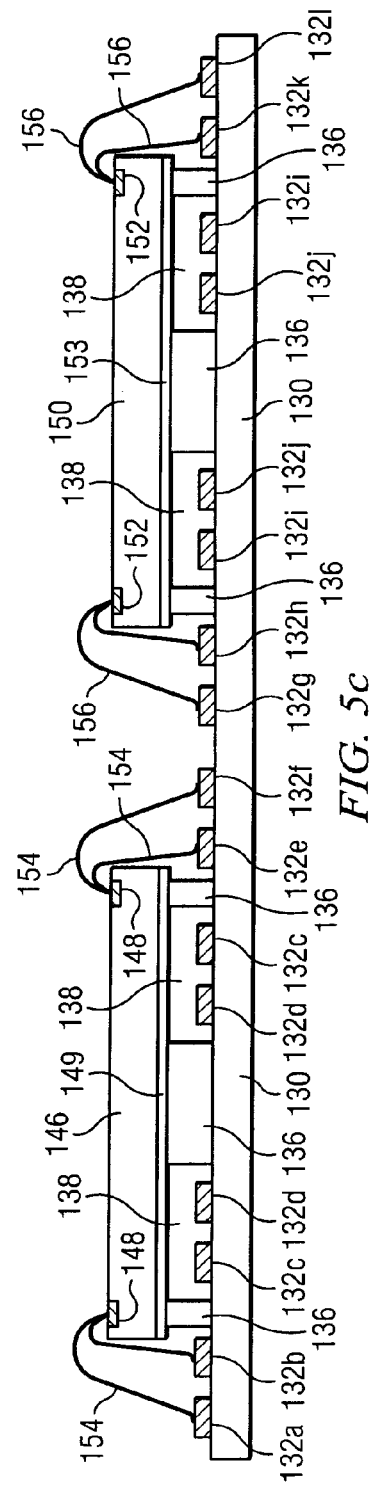

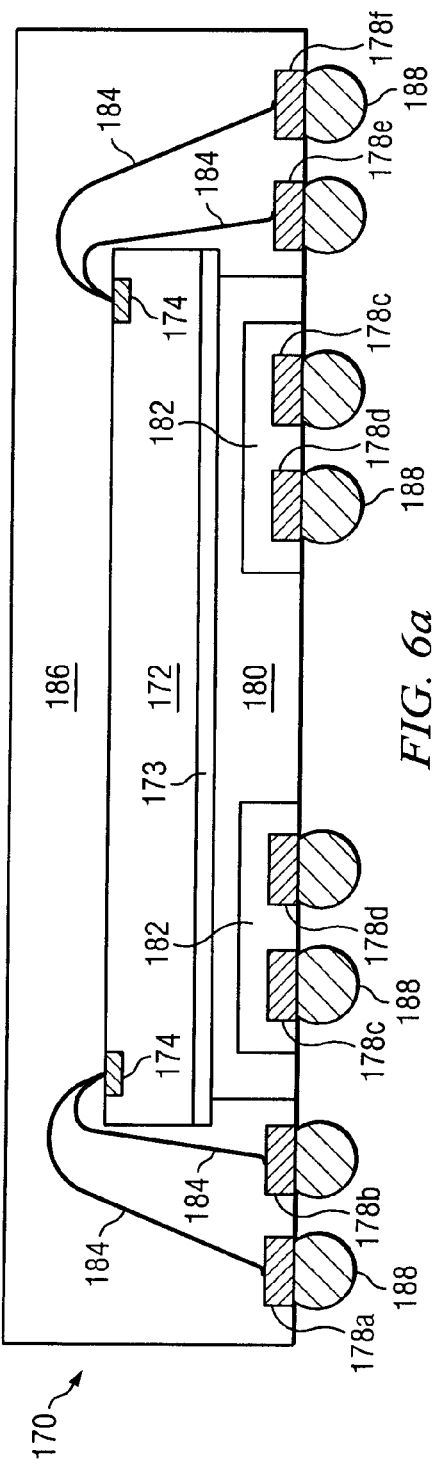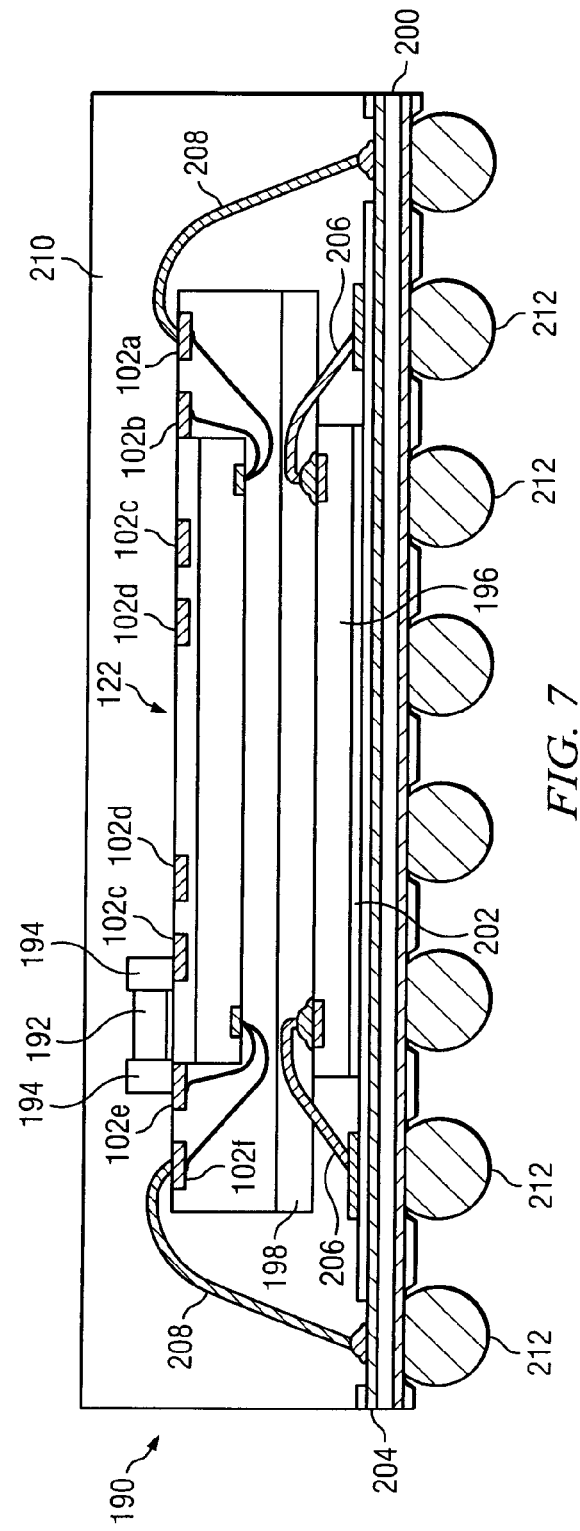

SEMICONDUCTOR DEVICE AND METHOD OF FORMING AN IPD BENEATH A SEMICONDUCTOR DIE WITH DIRECT CONNECTION TO EXTERNAL DEVICES

FIELD OF THE INVENTION

The present invention relates in general to semiconductor devices and, more particularly, to a semiconductor device having an integrated passive device formed beneath a semiconductor die with direct connection to external devices.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power generation, networks, computers, and consumer products. Semiconductor devices are also found in electronic products including military, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including transistors, control the flow of electrical current. By varying levels of doping and application of an electric field, the transistor either promotes or restricts the flow of electrical current. Passive structures, including resistors, diodes, and inductors, create a relationship between voltage and current necessary to perform a variety of electrical functions. The passive and active structures are electrically connected to form logic circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. Increases in device performance can be accomplished by forming active components that are capable of operating at higher speeds. In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions. However, high frequency electrical devices generate or are susceptible to undesired electromagnetic interference (EMI) and radio frequency interference (RFI), or other inter-device interference, such as capacitive, inductive, or conductive coupling, also known as cross-talk.

Another goal of semiconductor manufacturing is to produce semiconductor devices with adequate heat dissipation. High frequency semiconductor devices generally generate more heat. Without effective heat dissipation, the generated heat can reduce performance, decrease reliability, and reduce the useful lifetime of the semiconductor device.

SUMMARY OF THE INVENTION

A need exists for a semiconductor device having high-quality IPDs with greater interconnect capability. Accordingly, in one embodiment, the present invention is a method of manufacturing a semiconductor device comprising the steps of providing a substrate, and forming a conductive layer on the substrate. The conductive layer has a first portion constituting contact pads and a second portion constituting one or more inductors. The method further includes the steps of providing a semiconductor die with an insulating spacer and, leading with the insulating spacer, mounting the semiconductor die to the substrate over the second portion of the conductive layer. The method further includes the steps of forming an electrical connection between contact pads on the semiconductor die and the contact pads on the substrate, forming an encapsulant around the semiconductor die, electrical connections, insulating spacer, and conductive layer, and removing the substrate to expose the conductive layer.

In another embodiment, the present invention is a method of manufacturing a semiconductor device comprising the steps of providing a substrate, and forming a conductive layer on the substrate. The conductive layer has a first portion constituting contact pads and a second portion constituting an integrated passive device. The method further includes the steps of forming a spacer on the substrate around the second portion of the conductive layer, mounting a semiconductor die to the spacer, forming an electrical connection between contact pads on the semiconductor die and the contact pads on the substrate, forming an encapsulant around the semiconductor die, electrical connections, and conductive layer, and removing the substrate to expose the conductive layer.

In another embodiment, the present invention is a method of manufacturing a semiconductor device comprising the steps of providing a substrate, and forming a conductive layer on the substrate. The conductive layer includes an integrated passive device. The method further includes the steps of forming a spacer on the substrate around the conductive layer, mounting a semiconductor die to the spacer, forming an encapsulant around the semiconductor die and conductive layer, and removing the substrate to expose the conductive layer.

In another embodiment, the present invention is a semiconductor device comprising a spacer and semiconductor die mounted over the spacer. A conductive layer is formed below the spacer. The conductive layer includes an integrated passive device which is exposed from the semiconductor device. An encapsulant is formed around the semiconductor die and conductive layer.

BRIEF DESCRIPTION OF THE DRAWINGS

FIGS. 3a-3g illustrate a process of making a semiconductor device having an IPD formed beneath a semiconductor die with direct connection to external devices;

FIGS. 4a-4c illustrate a passivation layer disposed around the interconnect structure of the semiconductor device;

FIGS. 5a-5f illustrate another process of making a semiconductor device having an IPD formed beneath a semiconductor die with direct connection to external devices;

FIGS. 6a-6b illustrate the semiconductor device with conductive spacer providing EMI and RFI shielding;

FIG. 7 illustrates a PiP incorporating the semiconductor device having IPD formed beneath the semiconductor die with direct connection to external devices.

DETAILED DESCRIPTION OF THE DRAWINGS

Figure 1:
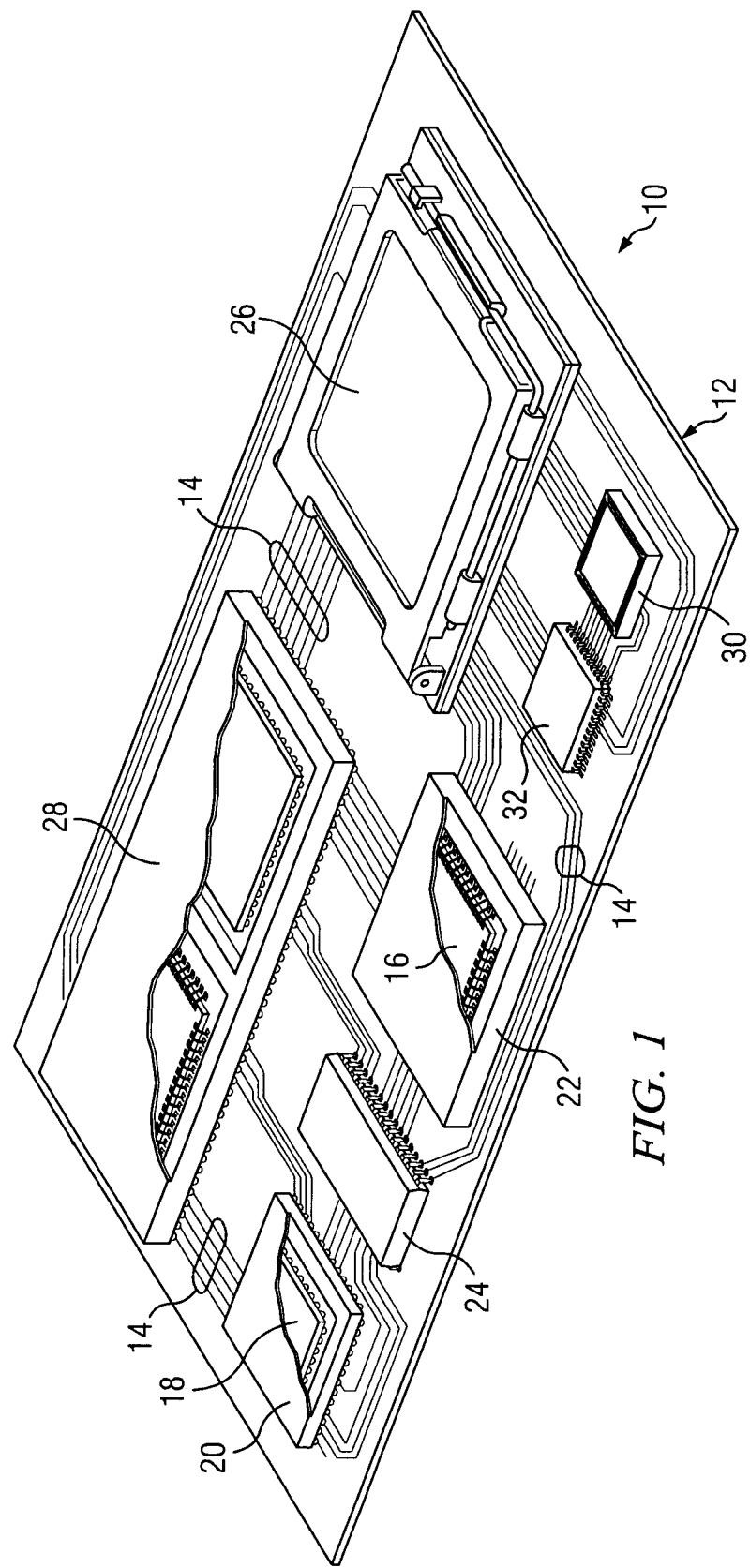
FIG. 1 illustrates a printed circuit board (PCB) with different types of packages mounted to its surface.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed on the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the way the semiconductor material changes in conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting device or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 10 having a chip carrier substrate or printed circuit board (PCB) 12 with a plurality of semiconductor packages mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 12 provides a general substrate for structural support and electrical interconnect of the semiconductor packages mounted on the PCB. Conductive signal traces 14 are formed on a surface or within layers of PCB 12 using evaporation, electrolytic plating, electroless plating, screen printing, PVD, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is a technique for mechanically and electrically attaching the semiconductor die to a carrier. Second level packaging involves mechanically and electrically attaching the carrier to the PCB. In other embodiments, a semiconductor device may only have the first level packaging where the die is mechanically and electrically mounted directly to the PCB.

For the purpose of illustration, several types of first level packaging, including wire bond package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a shorter manufacturing process. The resulting devices are less likely to fail and less expensive to manufacture resulting in lower costs for consumers.

Figure 2A:
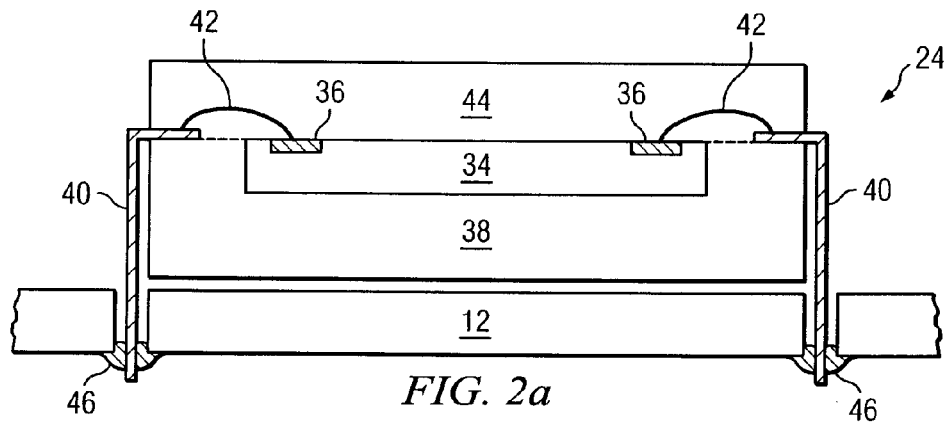
FIGS. 2a-2c illustrate further detail of the representative semiconductor packages mounted to the PCB.

FIG. 2a illustrates further detail of DIP 24 mounted on PCB 12. DIP 24 includes semiconductor die 34 having contact pads 36. Semiconductor die 34 includes an active region containing analog or digital circuits implemented as active devices, passive devices, conductive layers, and dielectric layers formed within semiconductor die 34 and are electrically interconnected according to the electrical design of the die. For example, the circuit may include one or more transistors, diodes, inductors, capacitors, resistors, and other circuit elements formed within the active region of die 34. Contact pads 36 are made with a conductive material, such as aluminum (Al), copper (Cu), tin (Sn), nickel (Ni), gold (Au), or silver (Ag), and are electrically connected to the circuit elements formed within die 34. Contact pads 36 are formed by PVD, CVD, electrolytic plating, or electroless plating process. During assembly of DIP 24, semiconductor die 34 is mounted to a carrier 38 using a gold-silicon eutectic layer or adhesive material such as thermal epoxy. The package body includes an insulative packaging material such as polymer or ceramic. Conductor leads 40 are connected to carrier 38 and wire bonds 42 are formed between leads 40 and contact pads 36 of die 34 as a first level packaging. Encapsulant 44 is deposited over the package for environmental protection by preventing moisture and particles from entering the package and contaminating die 34, contact pads 36, or wire bonds 42. DIP 24 is connected to PCB 12 by inserting leads 40 into holes formed through PCB 12. Solder material 46 is flowed around leads 40 and into the holes to physically and electrically connect DIP 24 to PCB 12. Solder material 46 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free.

Figure 2B:
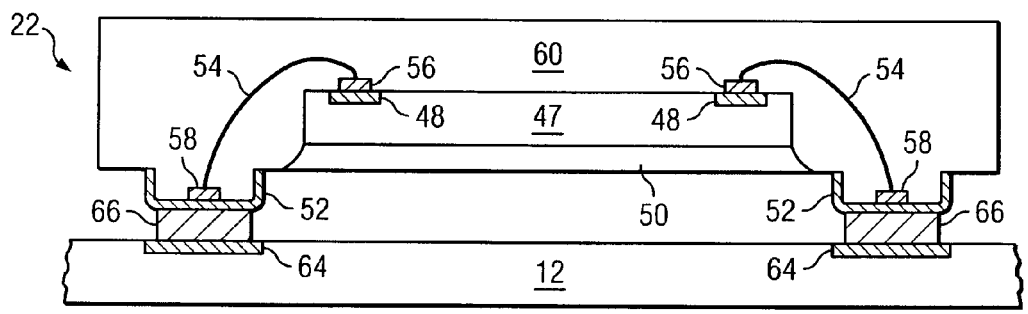

FIG. 2b illustrates further detail of BCC 22 mounted on PCB 12. Semiconductor die 47 is connected to a carrier by wire bond style first level packaging. BCC 22 is mounted to PCB 12 with a BCC style second level packaging. Semiconductor die 47 having contact pads 48 is mounted over a carrier using an underfill or epoxy-resin adhesive material 50. Semiconductor die 47 includes an active region containing analog or digital circuits implemented as active devices, passive devices, conductive layers, and dielectric layers formed within semiconductor die 47 and are electrically interconnected according to the electrical design of the die. For example, the circuit may include one or more transistors, diodes, inductors, capacitors, resistors, and other circuit elements formed within the active region of die 47. Contact pads 48 are made with a conductive material, such as Al, Cu, Sn, Ni, Au, or Ag, and are electrically connected to the circuit elements formed within die 47. Contact pads 48 are formed by PVD, CVD, electrolytic plating, or electroless plating process. Wire bonds 54 and bond pads 56 and 58 electrically connect contact pads 48 of semiconductor die 47 to contact pads 52 of BCC 22 forming the first level packaging. Molding compound or encapsulant 60 is deposited over semiconductor die 47, wire bonds 54, contact pads 48, and contact pads 52 to provide physical support and electrical isolation for the device. Contact pads 64 are formed on a surface of PCB 12 using evaporation, electrolytic plating, electroless plating, screen printing, PVD, or other suitable metal deposition process and are typically plated to prevent oxidation. Contact pads 64 electrically connect to one or more conductive signal traces 14. Solder material is deposited between contact pads 52 of BCC 22 and contact pads 64 of PCB 12. The solder material is reflowed to form bumps 66 which form a mechanical and electrical connection between BCC 22 and PCB 12.

Figure 2C:
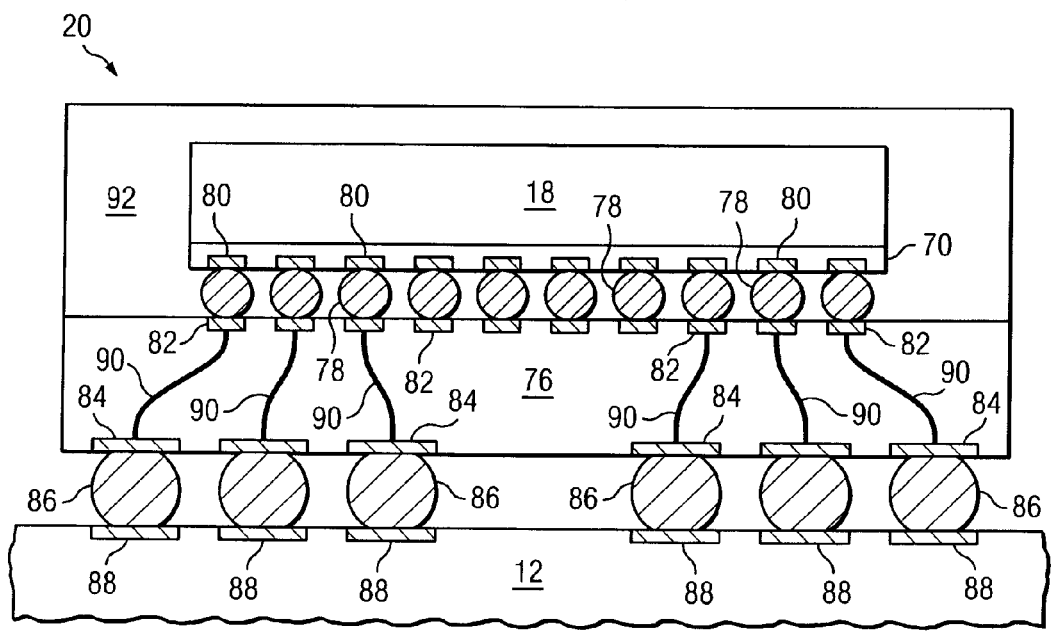

In FIG. 2c, semiconductor die 18 is mounted face down to carrier 76 with a flip chip style first level packaging. BGA 20 is attached to PCB 12 with a BGA style second level packaging. Active region 70 containing analog or digital circuits implemented as active devices, passive devices, conductive layers, and dielectric layers formed within semiconductor die 18 is electrically interconnected according to the electrical design of the die. For example, the circuit may include one or more transistors, diodes, inductors, capacitors, resistors, and other circuit elements formed within active region 70 of semiconductor die 18. Semiconductor die 18 is electrically and mechanically attached to carrier 76 through a large number of individual conductive solder bumps or balls 78. Solder bumps 78 are formed on bump pads or interconnect sites 80, which are disposed on active region 70. Bump pads 80 are made with a conductive material, such as Al, Cu, Sn, Ni, Au, or Ag, and are electrically connected to the circuit elements formed in active region 70. Bump pads 80 are formed by PVD, CVD, electrolytic plating, or electroless plating process. Solder bumps 78 are electrically and mechanically connected to contact pads or interconnect sites 82 on carrier 76 by a solder reflow process.

BGA 20 is electrically and mechanically attached to PCB 12 by a large number of individual conductive solder bumps or balls 86. The solder bumps are formed on bump pads or interconnect sites 84. The bump pads 84 are electrically connected to interconnect sites 82 through conductive lines 90 routed through carrier 76. Contact pads 88 are formed on a surface of PCB 12 using evaporation, electrolytic plating, electroless plating, screen printing, PVD, or other suitable metal deposition process and are typically plated to prevent oxidation. Contact pads 88 electrically connect to one or more conductive signal traces 14. The solder bumps 86 are electrically and mechanically connected to contact pads or bonding pads 88 on PCB 12 by a solder reflow process. Molding compound or encapsulant 92 is deposited over semiconductor die 18 and carrier 76 to provide physical support and electrical isolation for the device. The flip chip semiconductor device provides a short electrical conduction path from the active devices on semiconductor die 18 to conduction tracks on PCB 12 in order to reduce signal propagation distance, lower capacitance, and achieve overall better circuit performance. In another embodiment, the semiconductor die 18 can be mechanically and electrically attached directly to PCB 12 using flip chip style first level packaging without carrier 76.

Figure 3A:
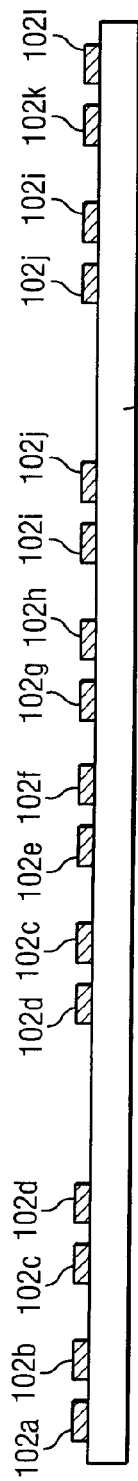

FIGS. 3a-3g illustrate a process of forming an integrated passive device (IPD) beneath a semiconductor die with direct connection to external devices. In FIG. 3a, carrier 100 contains dummy or sacrificial base material such as silicon, polymer, polymer composite, metal, ceramic, glass, glass epoxy, beryllium oxide, or other suitable low-cost, rigid material.

An electrically conductive layer 102 is formed on carrier 100 using a patterning and deposition process. Conductive layer 102 includes individual portions or sections 102a-102l. In one embodiment, conductive layer 102 is stacked Ti/NiV/Cu or Al/NiV/Cu with Ti or AL as an adhesive layer, nickel vanadium (NiV) as a barrier layer, and Cu as a wetting layer. Alternatively, conductive layer 102 can be Al, Cu, Sn, Ni, Au, Ag, or other suitable electrically conductive material with optional adhesion and barrier layers containing titanium (Ti), titanium tungsten (TiW), titanium nitride (TiN), tantalum (Ta), or tantalum nitride (TaN). The deposition of conductive layer 102 uses PVD, CVD, lamination, electrolytic plating, or electroless plating process.

Conductive layer 102a-102b, 102e-102h, and 102k-102l are contact pads for interconnectivity to other devices. Conductive layer 102c-102d constitute first and second IPDs, respectively, in this case inductors, disposed beneath semiconductor die 104. Likewise, conductive layer 102i-102j constitute first and second IPDs, respectively, in this case inductors, disposed beneath semiconductor die 110. The conductive layer 102c-102d and 102i-102j are typically wound or coiled in plan-view to produce or exhibit the desired inductive properties.

The IPDs formed by conductive layer 102c-102d and 102i-102j provide the electrical characteristics needed for high frequency applications, such as resonators, high-pass filters, low-pass filters, band-pass filters, symmetric Hi-Q resonant transformers, matching networks, and tuning capacitors. The IPDs can be used as front-end wireless RF components, which can be positioned between the antenna and transceiver. The IPD inductor can be a hi-Q balun, transformer, or coil, operating up to 100 Gigahertz. In some applications, multiple baluns are formed on a same substrate, allowing multi-band operation. For example, two or more baluns are used in a quad-band for mobile phones or other global system for mobile (GSM) communications, each balun dedicated for a frequency band of operation of the quad-band device. A typical RF system requires multiple IPDs and other high frequency circuits in one or more semiconductor packages to perform the necessary electrical functions. The high frequency electrical devices are susceptible to undesired electromagnetic interference (EMI) and radio frequency interference (RFI), or other inter-device interference, such as capacitive, inductive, or conductive coupling, also known as cross-talk.

Figure 3B:
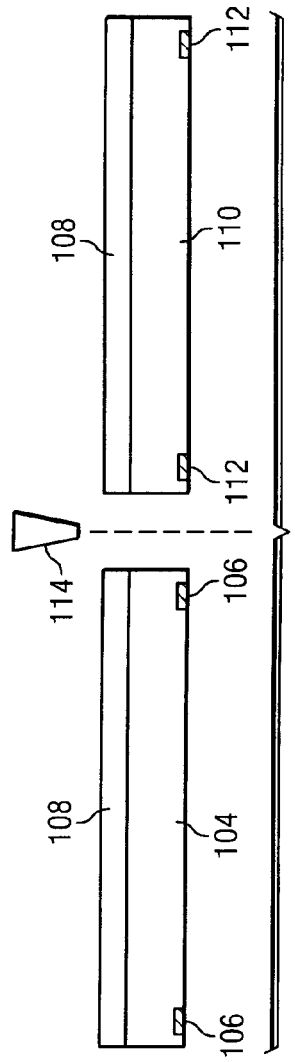

In FIG. 3b, a semiconductor die 104 includes contact pads 106 formed on its active surface. Likewise, a semiconductor die 110 includes contact pads 112 formed on its active surface. Semiconductor die 104 and 110 are formed on a common wafer using semiconductor manufacturing processed described above. Semiconductor die 104 and 110 each may contain analog or digital circuits, as well as IPDs, such as inductors, capacitors, and resistors. For example, semiconductor die 104 and 110 can be a baseband digital circuit, such as digital signal processor (DSP), memory, or other signal processing circuit.

An insulating spacer 108 is formed on back surfaces of semiconductor die 104 and 110, opposite contact pads 106 and 112, while in wafer form. The insulating spacer 108 is B-stage material, such as wire-on-film (WIF), suitable to partially embed the inductors into the spacer. The insulating spacer 108 is deposited using spin coating, lamination, or taping. The insulating spacer 108 can be made with single or multiple layers. The wafer is singulated by saw blade 114 into individual die 104 and 110.

Figure 3C:
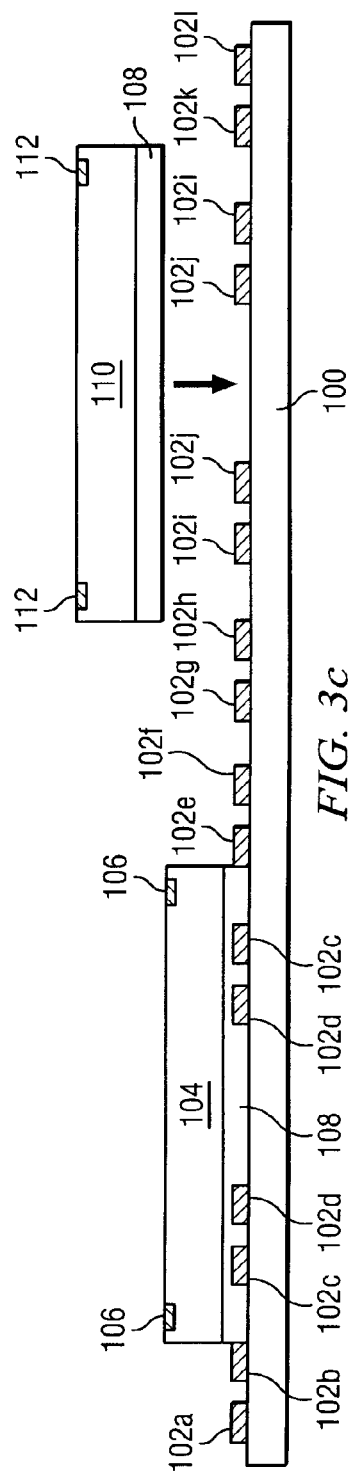

In FIG. 3c, semiconductor die 104 and 110 are mounted to carrier 100, leading with insulating spacer 108. The insulating spacer 108 partially encloses conductive layers 102c-102d and 102i-102j, respectively. The inductors formed by conductive layers 102c-102d and 102i-102j are thus partially embedded within insulating spacer 108. The insulating spacer 108 is cured to harden the material.

In FIG. 3d, bond wires 116 form an electrical conduction path between contact pads 106 and conductive layer 102a, 102b, 102e, and 102f. Bond wires 118 form an electrical conduction path between contact pads 112 and conductive layer 102g, 102h, 102k, and 102l.

FIG. 3e shows an encapsulant or molding compound 120 deposited over and around semiconductor die 104 and 110, insulating spacer 108, and bond wires 116-118 using a paste printing, compressive molding, transfer molding, liquid encapsulant molding, or other suitable applicator. Encapsulant 120 can be epoxy resin, epoxy acrylate, polymer, or polymer composite material. Encapsulant 120 is non-conductive and environmentally protects the semiconductor device from external elements and contaminants. Encapsulant 120 reduces leakage from the inductors formed by conductive layer 102c-102d and 102i-102j and improves RF performance.

In FIG. 3f, the temporary carrier 100 is removed from semiconductor package 122 by chemical etching, mechanical peel-off, CMP, or mechanical grinding. By removing carrier 100, conductive layer 102 is exposed from the backside of semiconductor package 122.

An electrically conductive solder material is deposited over conductive layer 102 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 124. In some applications, solder bumps 124 are reflowed a second time to improve electrical contact to conductive layer 102. Solder bumps 124 represent one type of interconnect structure that can be formed on conductive layer 102. The interconnect structure can also use bond wires, 3D interconnects, conductive paste, or other electrical interconnect. The semiconductor die are singulated by laser cutting or saw blade to provide a system-in-package (SiP) arrangement.

Figure 3G:
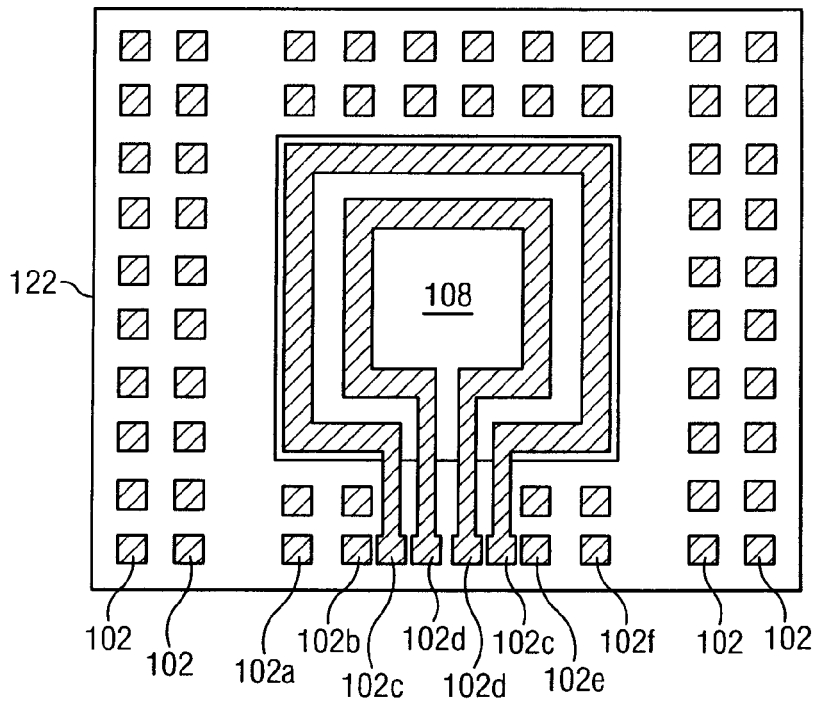

FIG. 3g is a bottom-view of semiconductor package 122 following singulation, without solder bumps 124. Conductive layer 102a, 102b, 102e, and 102f electrically connect through bond wires 116 to contact pads 106. The inductors formed by conductive layer 102c-102d are disposed under semiconductor die 104 and partially enclosed by insulating spacer 108. When solder bumps 124 are formed, contact pads 106 located on the top-side of semiconductor die 104 are electrically accessible for external devices through the solder bumps. Likewise, the inductors formed by conductive layer 102c-102d are directly accessible as contact pads to external devices. The direct connection between the inductors formed by conductive layer 102c-102d and external devices provides a shorter signal propagation path and improves performance. In addition, the inductors disposed beneath semiconductor die 104 provides a smaller footprint and reduces overall package size. The contact pads can interconnect with known good dies (KGDs) and known good packages (KGPs).

In FIG. 4a, SiP 125 is shown with similar features, using similar semiconductor manufacturing processes and the same references numbers as FIG. 3f. A passivation layer 126 is formed over insulating spacer 108 and encapsulant 120 prior to forming solder bumps 124. Passivation layer 126 can be polyimide, BCB, PBO, SiO2, Si3N4, SiON, Ta2O5, Al2O3, or other similar insulating and structural properties. Passivation layer 126 can also be laminated solder mask for a low-cost solution. The deposition of passivation layer 126 may involve spin coating, PVD, CVD, printing, sintering, or thermal oxidation. A portion of passivation layer 126 is removed to expose conductive layer 102. Solder bumps 124 are then formed on conductive layer 102a-102f as described above.

Figure 4B:
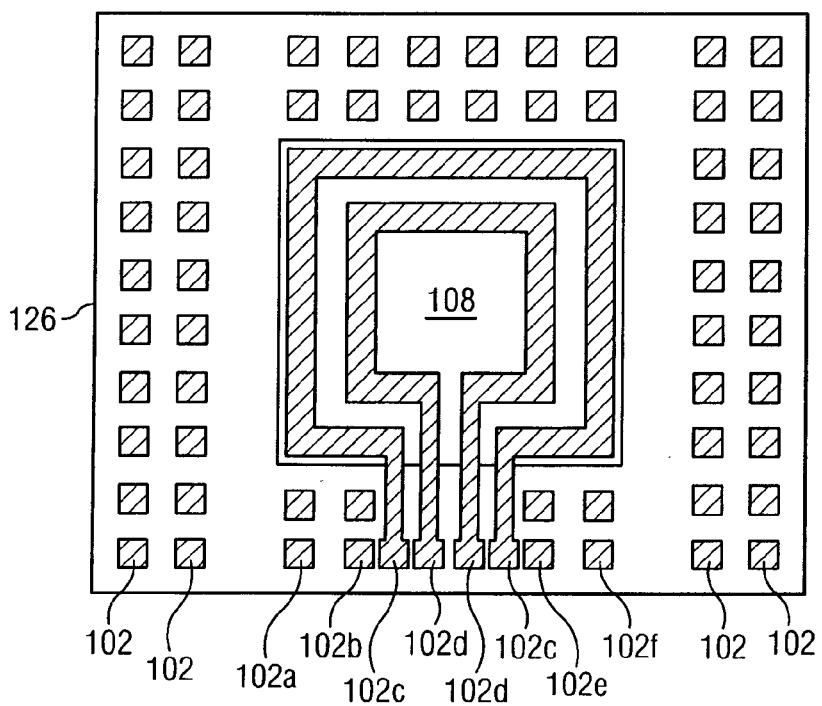

FIG. 4b is a bottom-view of SiP 125 following singulation, without solder bumps 124. Conductive layer 102a, 102b, 102e, and 102f electrically connect through bond wires 116 to contact pads 106. The inductors formed by conductive layer 102c-102d are disposed under semiconductor die 104 and partially enclosed by insulating spacer 108. When solder bumps 124 are formed, contact pads 106 located on the top-side of semiconductor die 104 are electrically accessible through the solder bumps. Likewise, the inductors formed by conductive layer 102c-102d are directly accessible as contact pads to external devices. The direct connection between the inductors and external devices provides a shorter signal propagation path and improves performance. In addition, the inductors disposed beneath semiconductor die 104 provides a smaller footprint and reduces overall package size.

FIG. 4c shows passivation layer 126 partially covering conductive layer 102 to mechanically lock and prevent peeling of the conductive layer.

Another embodiment of forming IPDs beneath a semiconductor die with direct connection to external devices is shown in FIGS. 5a-5f. More specifically, in FIG. 5a, carrier 130 contains dummy or sacrificial base material such as silicon, polymer, polymer composite, metal, ceramic, glass, glass epoxy, beryllium oxide, or other suitable low-cost, rigid material.

An electrically conductive layer 132 is formed on carrier 130 using a patterning and deposition process. Conductive layer 132 includes individual portions or sections 132a-132l. In one embodiment, conductive layer 132 is stacked Ti/NiV/Cu or Al/NiV/Cu with Ti or AL as an adhesive layer, nickel vanadium (NiV) as a barrier layer, and Cu as a wetting layer. Alternatively, conductive layer 132 can be Al, Cu, Sn, Ni, Au, Ag, or other suitable electrically conductive material with optional adhesion and barrier layers containing Ti, TiW, TiN, Ta, or TaN. The deposition of conductive layer 132 uses PVD, CVD, lamination, electrolytic plating, or electroless plating process. Conductive layer 132a-132b, 132e-132h, and 132k-132l are contact pads for connectivity to other devices. Conductive layer 132c-132d constitute first and second IPDs, respectively, in this case inductors. Likewise, conductive layer 132i-132j constitute first and second IPDs, respectively, in this case inductors. The conductive layer 132c-132d and 132i-132j are typically wound or coiled in plan-view to produce or exhibit the desired inductive properties.

A plurality of insulating spacers 136 is formed on carrier 100 extending above conductive layer 132. The insulating spacer can be epoxy, polymer, or semiconductor material which is deposited using spin coating, lamination, or taping. The insulating spacers 136 can be made with single or multiple layers. The number, size, and shape of insulating spacers 136 can be varied depending on the application. For example, the inductors can be offset to one side of the package.

In FIG. 5b, semiconductor die 146 includes contact pads 148 formed on its active surface. Likewise, semiconductor die 150 includes contact pads 152 formed on its active surface. Semiconductor die 146 and 150 each may contain analog or digital circuits, as well as IPDs, such as inductors, capacitors, and resistors. For example, semiconductor die 146 and 150 can be a baseband digital circuit, such as DSP, memory, or other signal processing circuit. Semiconductor die 146 and 150 are respectively mounted to insulating spacers 136 with die-attach adhesive 149 and 153, leaving a space or gap 138 between the die and conductive layer 132c-132d and 132i-132j. In one embodiment, gap 138 is 10-100 micrometers (μm). The physical separation reduces EMI or RFI between the semiconductor die and inductors.

In FIG. 5c, bond wires 154 form an electrical conduction path between contact pads 148 and conductive layer 132a, 132b, 132e, and 132f. Bond wires 156 form an electrical conduction path between contact pads 152 and conductive layer 132g, 132h, 132k, and 132l.

Figure 5D:
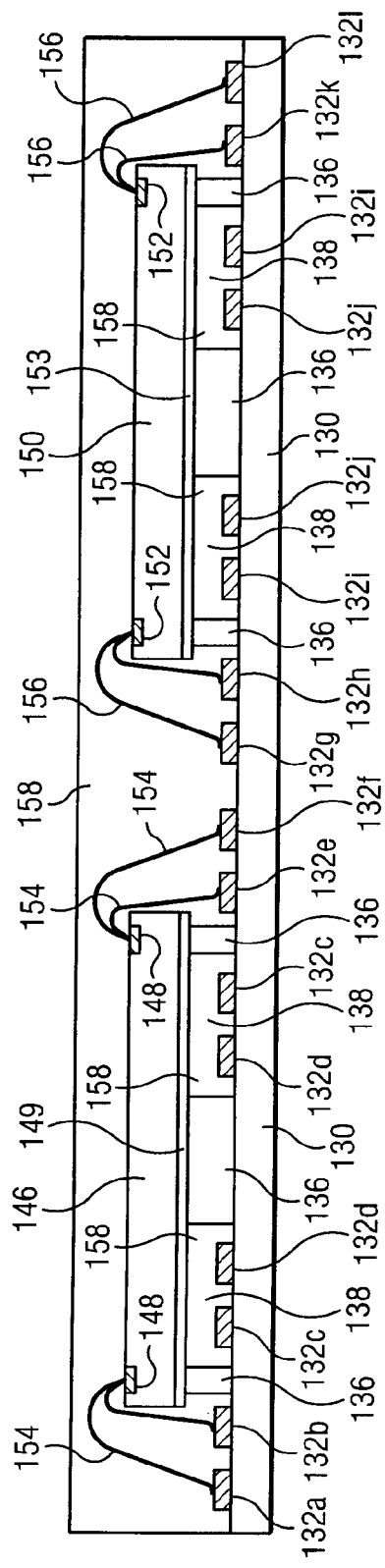

FIG. 5d shows an encapsulant or molding compound 158 deposited over and around semiconductor die 146 and 150, insulating spacers 136, and bond wires 154-156 using a paste printing, compressive molding, transfer molding, liquid encapsulant molding, or other suitable applicator. Encapsulant 158 can be epoxy resin, epoxy acrylate, polymer, or polymer composite material. Encapsulant 158 is non-conductive and environmentally protects the semiconductor device from external elements and contaminants. Encapsulant 158 partially encloses conductive layers 132c-132d and 132i-132j. The inductors formed by conductive layers 132c-132d and 132i-132j are thus partially embedded within encapsulant 158. Encapsulant 158 reduces leakage from the inductors formed by conductive layers 132c-132d and 132i-132j and improves RF performance.

Figure 5E:
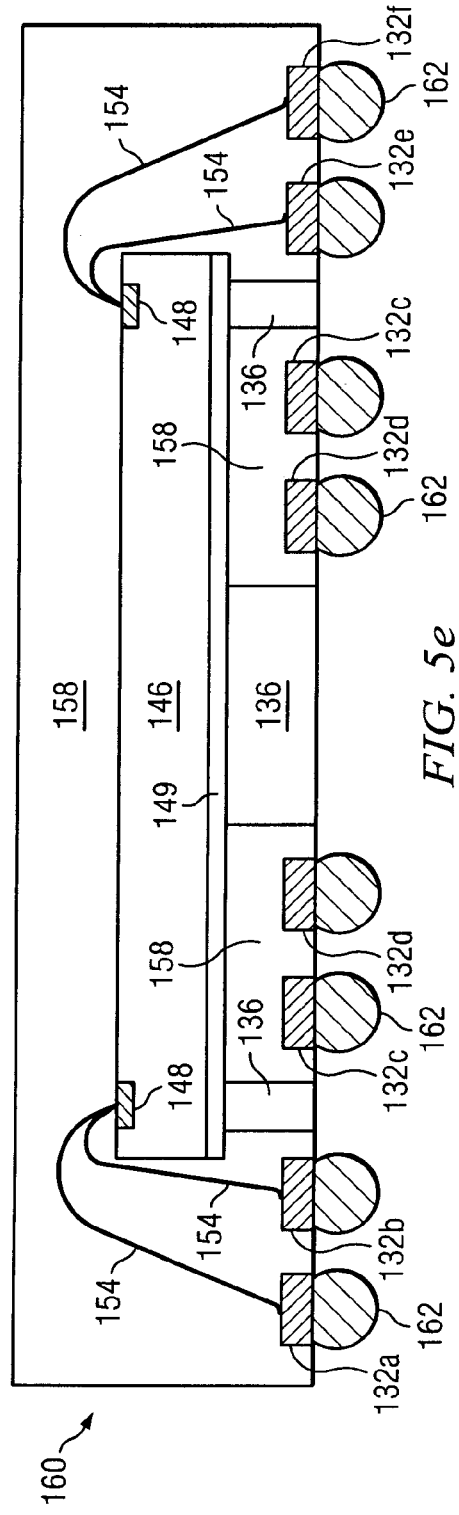

In FIG. 5e, the temporary carrier 130 is removed from semiconductor package 160 by chemical etching, mechanical peel-off, CMP, or mechanical grinding. By removing carrier 130, conductive layer 132 is exposed from the backside of semiconductor package 160.

An electrically conductive solder material is deposited over conductive layer 132 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 162. In some applications, solder bumps 162 are reflowed a second time to improve electrical contact to conductive layer 132. Solder bumps 162 represent one type of interconnect structure that can be formed on conductive layer 132. The interconnect structure can also use bond wires, 3D interconnects, conductive paste, or other electrical interconnect. The semiconductor die are singulated by laser cutting or saw blade to provide an SiP arrangement.

Figure 5F:
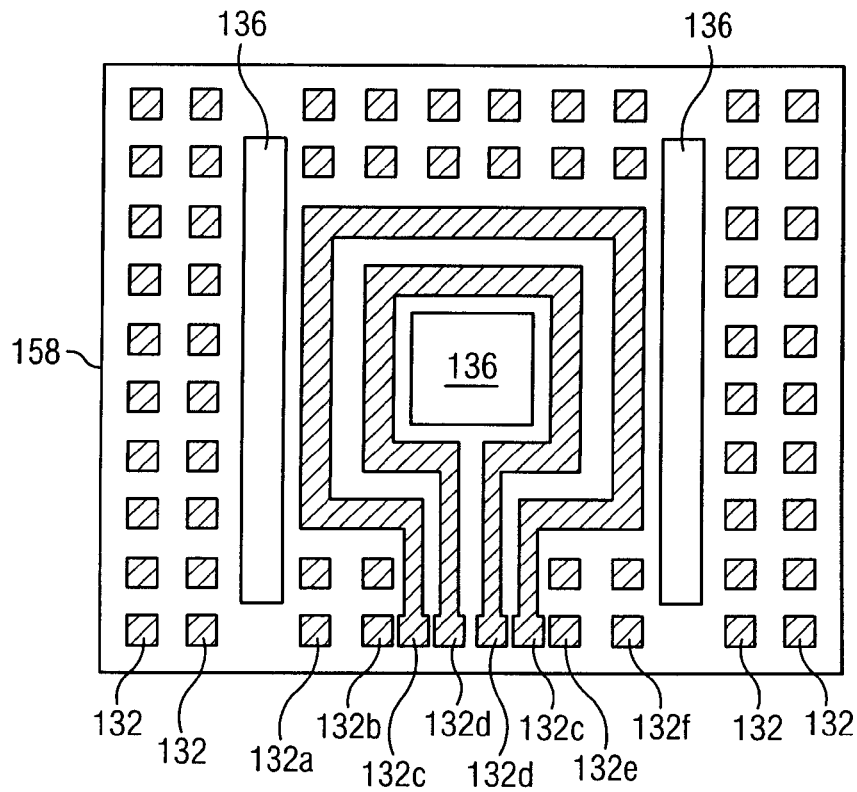

FIG. 5f is a bottom-view of semiconductor package 160 following singulation, without solder bumps 162. Conductive layer 132a, 132b, 132e, and 132f electrically connect through bond wires 154 to contact pads 148. The inductors formed by conductive layer 132c-132d are disposed under semiconductor die 146 and partially enclosed by encapsulant 158. When solder bumps 162 are formed, contact pads 148 located on the top-side of semiconductor die 146 are electrically accessible for external devices through the solder bumps. Likewise, the inductors formed by conductive layer 132c-132d are directly accessible as contacts. The direct connection between the inductors formed by conductive layers 132c-132d and external devices provides a shorter signal propagation path and improves performance. In addition, the inductors disposed beneath semiconductor die 146 provides a smaller footprint and reduces overall package size.

FIG. 6a shows a SiP 170 having similar features and using similar semiconductor manufacturing processes and the same references numbers as FIGS. 5a-5f. In this case, semiconductor package 170 includes semiconductor die 172 with contact pads 174. Semiconductor die 172 may contain analog or digital circuits, as well as IPDs, such as inductors, capacitors, and resistors. For example, semiconductor die 172 can be a baseband digital circuit, such as DSP, memory, or other signal processing circuit. Conductive layer 178a, 178b, 178e, and 178f are contact pads for connectivity to other devices. Conductive layer 178c-178d constitute first and second IPDs, respectively, in this case inductors. The conductive layer 178c-178d are typically wound or coiled in plan-view to produce or exhibit the desired inductive properties.

Semiconductor die 172 is mounted to spacer or cap 180 with die-attach adhesive 173, leaving gap 182 between the spacer and conductive layer 178c-178d. Cap 180 can be metal, such as Cu, Al, stainless steel, nickel silver, low-carbon steel, silicon-iron steel, foil, epoxy, conductive resin, and other metals and composites capable of blocking EMI, RFI, and other externally generated interference between the devices. Cap 180 also operates as a heat sink to provide thermal conduction path to remove heat from semiconductor die 172 and reduce its operating temperature. Bond wires 184 form an electrical conduction path between contact pads 174 and conductive layer 178a, 178b, 178e, and 178f.

An encapsulant or molding compound 186 is deposited over and around semiconductor die 172, shielding cap 180, and bond wires 184 using a paste printing, compressive molding, transfer molding, liquid encapsulant molding, or other suitable applicator. Encapsulant 186 can be epoxy resin, epoxy acrylate, polymer, or polymer composite material. Encapsulant 186 is non-conductive and environmentally protects the semiconductor device from external elements and contaminants. Encapsulant 186 partially encloses conductive layers 178c-178d. The inductors formed by conductive layers 178c-178d are thus partially embedded within encapsulant 186. Encapsulant 186 reduces leakage from the inductors formed by conductive layers 178c-178d and improves RF performance.

An electrically conductive solder material is deposited over conductive layer 178 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 188. In some applications, solder bumps 188 are reflowed a second time to improve electrical contact to conductive layer 178. Solder bumps 188 represent one type of interconnect structure that can be formed on conductive layer 178. The interconnect structure can also use bond wires, 3D interconnects, conductive paste, or other electrical interconnect.

Figure 6B:
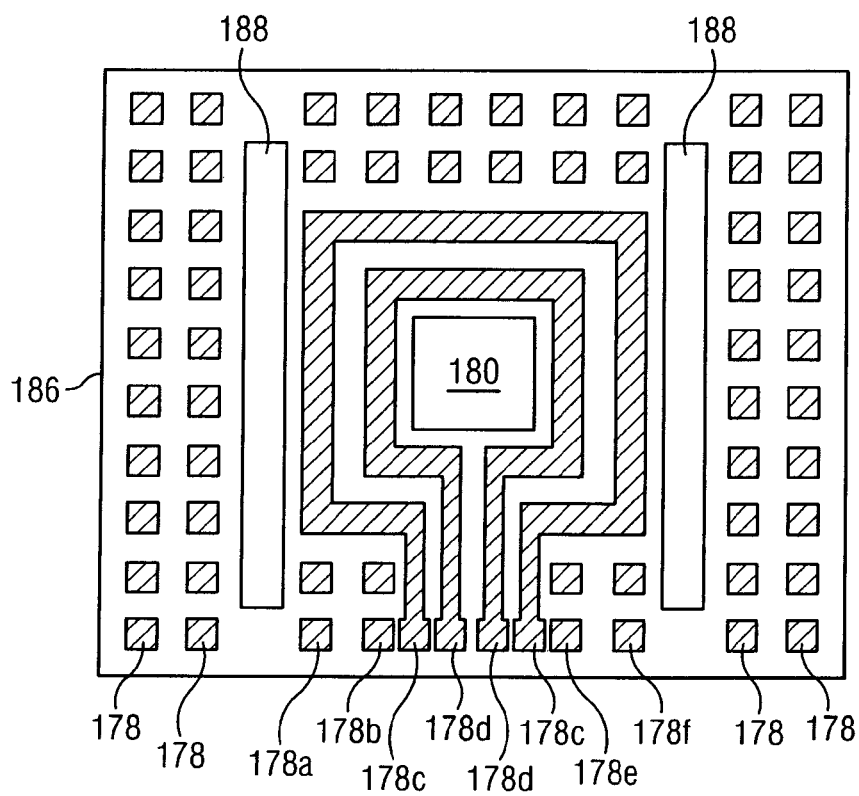

FIG. 6b is a bottom-view of SiP 170 following singulation, without solder bumps 188. Conductive layer 178a, 178b, 178e, and 178f electrically connect through bond wires 184 to contact pads 174. The inductors formed by conductive layer 178c-178d are disposed under semiconductor die 172 and partially enclosed by encapsulant 186. When solder bumps 188 are formed, contact pads 174 located on the top-side of semiconductor die 172, as well as the inductors formed by conductive layer 178c-178d located beneath semiconductor die 172, are each electrically accessible for external devices through the solder bumps.

FIG. 7 shows package-in-package (PiP) or internal stacking module (ISM) 190 using SiP 122 without solder bumps. The electrical connections 194 of semiconductor device 192 are mounted to conductive layer 102c and 102e using solder bumps, flipchip interconnect, metal bonding, or conductive paste (not show). In one embodiment semiconductor device 192 is a passive component such as a large value capacitor. SiP 122 is mounted to semiconductor die 196 with adhesive layer 198. Semiconductor die 196 is mounted to substrate 200 with adhesive layer 202. Substrate 200 includes electrical interconnect structure 204. Contact pads on semiconductor die 196 electrically connect to interconnect structure 204 in substrate 200 using bond wires 206. Contact pads 102a and 102f on SiP 122 electrically connect to interconnect structure 204 in substrate 200 using bond wires 208.

An encapsulant or molding compound 210 is deposited over and around SiP 122, semiconductor die 196, and bond wires 206-208 using a paste printing, compressive molding, transfer molding, liquid encapsulant molding, or other suitable applicator. Encapsulant 210 can be epoxy resin, epoxy acrylate, polymer, or polymer composite material. Encapsulant 210 is non-conductive and environmentally protects the semiconductor device from external elements and contaminants. Encapsulant 210 reduces leakage from the inductors formed by conductive layers 102c-102d and improves RF performance.

An electrically conductive solder material is deposited over interconnect structure 204 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 212. In some applications, solder bumps 212 are reflowed a second time to improve electrical contact to interconnect structure 204. Solder bumps 212 represent one type of interconnect structure that can be formed on interconnect structure 204. The interconnect structure can also use bond wires, 3D interconnects, conductive paste, or other electrical interconnect.

Figure 8:
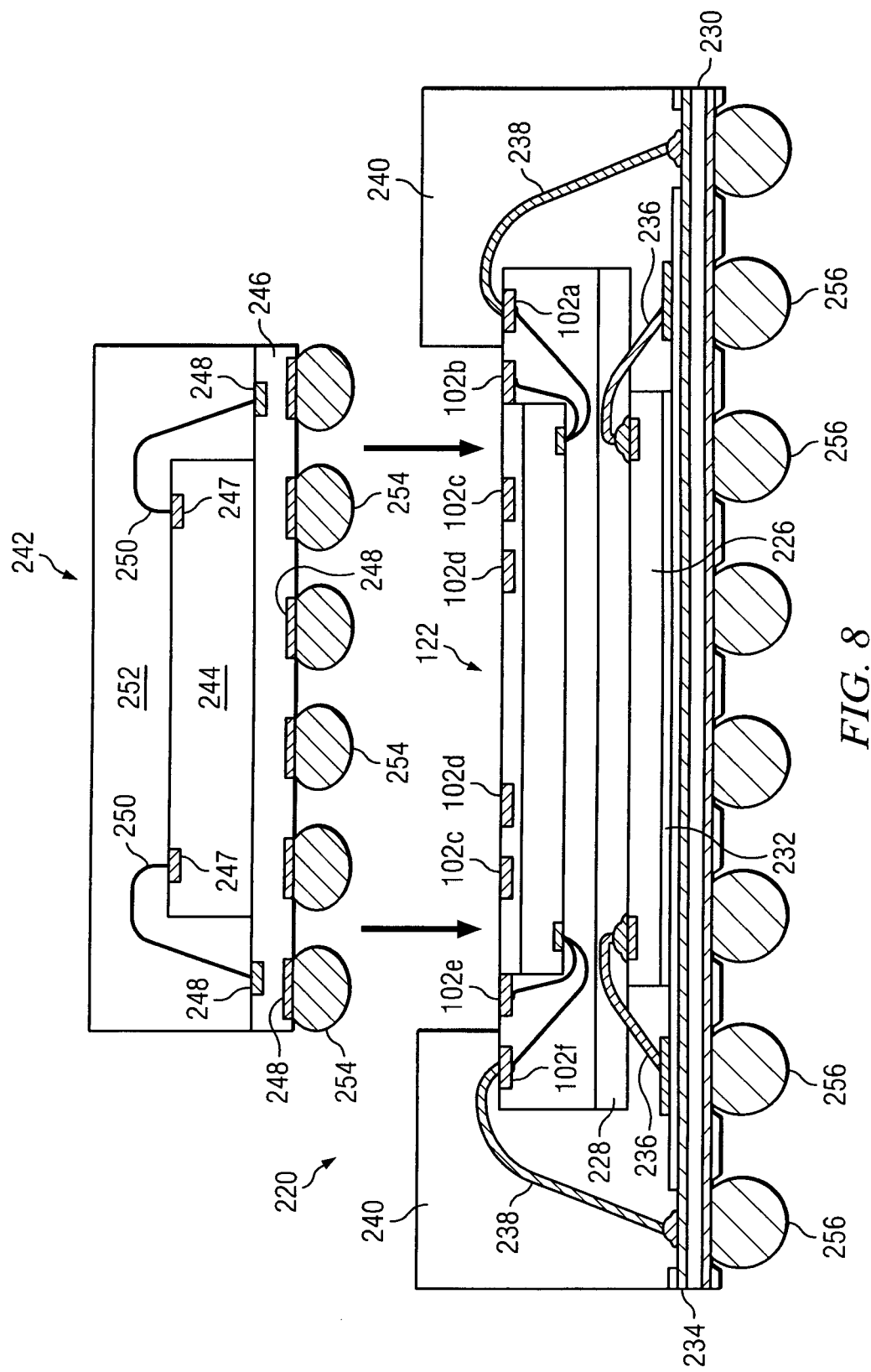
FIG. 8 illustrates a Fi-PoP incorporating the semiconductor device having IPD formed beneath the semiconductor die with direct connection to external devices.

FIG. 8 shows fan-in package-on-package (Fi-PoP) arrangement 220 using SiP 122 without solder bumps. SiP 122 is mounted to semiconductor die 226 with adhesive layer 228. Semiconductor die 226 is mounted to substrate 230 with adhesive layer 232. Substrate 230 includes electrical interconnect structure 234. Contact pads on semiconductor die 226 electrically connect to interconnect structure 234 in substrate 230 using bond wires 236. Contact pads 102a and 102f on SiP 122 electrically connect to interconnect structure 234 in substrate 230 using bond wires 238.

An encapsulant or molding compound 240 is deposited over and around SiP 122, semiconductor die 196, and bond wires 236-238 using a paste printing, compressive molding, transfer molding, liquid encapsulant molding, or other suitable applicator. Encapsulant 240 can be epoxy resin, epoxy acrylate, polymer, or polymer composite material. Encapsulant 240 is non-conductive and environmentally protects the semiconductor device from external elements and contaminants. Encapsulant 240 reduces leakage from the inductors formed by conductive layers 102c-102d and improves RF performance.

Semiconductor package 242 is formed by mounting semiconductor die 244 to substrate 246. Semiconductor die 244 may contain analog or digital circuits, as well as IPDs, such as inductors, capacitors, and resistors. For example, semiconductor die 244 can be a baseband digital circuit, such as DSP, memory, or other signal processing circuit. Contact pads 247 on semiconductor die 244 electrically connect to interconnect structure 248 in substrate 248 using bond wires 250. An encapsulant 252 is deposited over semiconductor die 244, substrate 246, and bond wires 250. Solder bumps 254 are formed on interconnect structure 248. Semiconductor package 242 is mounted to SiP 122 using solder bumps 254 to electrically connect directly to conductive layer 102b-102e.

Accordingly, the IPDs formed by conductive layers 102c-102d make direct electrical contact with semiconductor die 244 by way of solder bumps 254, interconnect structure 248, and bond wires 250. The direct connection between the inductors formed by conductive layers 102c-102d and semiconductor die 244 provides a shorter signal propagation path and improves performance. In addition, the inductors provide a smaller footprint and reduces overall package size.

An electrically conductive solder material is deposited over interconnect structure 234 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 256. In some applications, solder bumps 256 are reflowed a second time to improve electrical contact to interconnect structure 234. Solder bumps 256 represent one type of interconnect structure that can be formed on interconnect structure 234. The interconnect structure can also use bond wires, 3D interconnects, conductive paste, or other electrical interconnect.

In summary, an IPD (inductor) is disposed beneath the semiconductor die to save space and provide a direct connection to external devices. By integrating the IPD in an SiP or SoP, lower manufacturing cost are realized using conventional processes. The inductor performance improves by enclosing the device in encapsulant to reduce leakage.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of manufacturing a semiconductor device, comprising:
   providing a substrate;
   forming a conductive layer directly on the substrate including a first portion constituting first contact pads and a second portion of the conductive layer constituting an inductor formed between and substantially coplanar with the first portion;
   providing a semiconductor die including an insulating spacer;
   mounting the semiconductor die to the substrate over the second portion of the conductive layer with the insulating spacer directly contacting the semiconductor die and the substrate;
   forming electrical connections between second contact pads on the semiconductor die and the first contact pads on the substrate;
   forming an encapsulant around the semiconductor die, electrical connections, insulating spacer, and conductive layer; and
   removing the substrate to expose the conductive layer.

2. The method of claim 1, further including forming an interconnect structure on the conductive layer.

3. The method of claim 1, further including:
   forming an insulating layer on the conductive layer, insulating spacer, and encapsulant;
   removing a portion of the insulating layer over the conductive layer; and
   forming an interconnect structure over the conductive layer in the removed portion of the insulating layer.

4. The method of claim 3, wherein the insulating layer overlaps the conductive layer.

5. The method of claim 1, further including integrating the semiconductor device into a package, the conductive layer being electrically connected to other components in the package.

6. The method of claim 1, further including mounting a semiconductor device to the conductive layer.

7. A method of manufacturing a semiconductor device, comprising:
   providing a substrate;
   forming a conductive layer on the substrate, the conductive layer including a first portion constituting first contact pads and a second portion constituting an integrated passive device;
   forming a spacer on the substrate around the second portion of the conductive layer;
   mounting a semiconductor die to the spacer;
   forming an electrical connection between second contact pads on the semiconductor die and the first contact pads on the substrate;
   forming an encapsulant around the semiconductor die, electrical connections, and conductive layer; and
   removing the substrate to expose the conductive layer.

8. The method of claim 7, further including forming an interconnect structure on the conductive layer.

9. The method of claim 7, further including:
   forming an insulating layer on the conductive layer, spacer, and encapsulant;

removing a portion of the insulating layer over the conductive layer; and forming an interconnect structure in the removed portion of the insulating layer over the conductive layer.

10. The method of claim 9, wherein the insulating layer overlaps the conductive layer.

11. The method of claim 7, further including mounting a semiconductor device to the conductive layer.

12. The method of claim 7, further including integrating the semiconductor device into a package, the conductive layer being electrically connected to other components in the package.

13. The method of claim 7, wherein the integrated passive device includes an inductor.

14. The method of claim 7, wherein the spacer includes an insulating material.

15. The method of claim 7, wherein the spacer includes a conductive material for shielding.

16. A method of manufacturing a semiconductor device, comprising:
providing a substrate;
forming a conductive layer on the substrate, the conductive layer configured to operate as an integrated passive device;
forming a spacer on the substrate around the conductive layer;
mounting a semiconductor die to the spacer;
forming an encapsulant around the semiconductor die and conductive layer; and
removing the substrate to expose the conductive layer.

17. The method of claim 16, further including forming an interconnect structure on the conductive layer.

18. The method of claim 16, further including integrating the semiconductor device into a package, the conductive layer being electrically connected to other components in the package.

19. The method of claim 16, wherein the integrated passive device includes an inductor.

20. The method of claim 16, wherein the spacer includes an insulating material or a conductive material for shielding.

21. A method of manufacturing a semiconductor device, comprising:
providing a substrate;
forming a conductive layer on the substrate including a first portion comprising a first contact pad and a second portion of the conductive layer constituting an integrated passive device formed substantially coplanar with the first portion;
providing a semiconductor die including an insulating spacer;
mounting the semiconductor die to the substrate over the second portion of the conductive layer with the insulating spacer directly contacting the semiconductor die and the substrate;
forming an electrical connection between a second contact pad on the semiconductor die and the first contact pad on the substrate;
forming an encapsulant around the semiconductor die, electrical connection, insulating spacer, and conductive layer; and
removing the substrate to expose the conductive layer.

22. The method of claim 21, further including forming an interconnect structure on the conductive layer.

23. The method of claim 21, further including:
forming an insulating layer on the conductive layer, insulating spacer, and encapsulant;
removing a portion of the insulating layer over the conductive layer; and
forming an interconnect structure over the conductive layer in the removed portion of the insulating layer.

24. The method of claim 23, wherein the insulating layer overlaps the conductive layer.

25. The method of claim 21, further including integrating the semiconductor device into a package, the conductive layer being electrically connected to other components in the package.

26. The method of claim 21, further including mounting a semiconductor device to the conductive layer.

27. A method of manufacturing a semiconductor device, comprising:
providing a substrate;
forming a conductive layer on the substrate including a first portion comprising a first contact pad and a second portion of the conductive layer configured to operate as an integrated passive device formed substantially coplanar with the first portion;
providing a semiconductor die including an insulating spacer;
mounting the semiconductor die to the substrate over the second portion of the conductive layer;
forming an encapsulant around the semiconductor die, insulating spacer, and conductive layer; and
removing the substrate to expose the conductive layer.

28. The method of claim 27, further including forming an interconnect structure on the conductive layer.

29. The method of claim 27, further including:
forming an insulating layer on the conductive layer, insulating spacer, and encapsulant;
removing a portion of the insulating layer over the conductive layer; and
forming an interconnect structure over the conductive layer in the removed portion of the insulating layer.

30. The method of claim 29, wherein the insulating layer overlaps the conductive layer.

31. The method of claim 27, further including integrating the semiconductor device into a package, the conductive layer being electrically connected to other components in the package.

32. The method of claim 27, further including forming an electrical connection between a second contact pad on the semiconductor die and the first contact pad on the substrate.

33. A method of manufacturing a semiconductor device, comprising:
providing a substrate;
forming a conductive layer on the substrate including a first portion comprising a first contact pad and a second portion configured to operate as an integrated passive device;
providing a semiconductor die;
disposing an insulating spacer between the semiconductor die and substrate; and
mounting the semiconductor die to the substrate over the second portion of the conductive layer.

34. The method of claim 33, further including forming an interconnect structure on the conductive layer.

35. The method of claim 33, further including forming an encapsulant around the semiconductor die, insulating spacer, and conductive layer.

36. The method of claim 35, further including:
forming an insulating layer on the conductive layer, insulating spacer, and encapsulant;
removing a portion of the insulating layer over the conductive layer; and forming an interconnect structure over the conductive layer in the removed portion of the insulating layer.

37. The method of claim 36, wherein the insulating layer overlaps the conductive layer.

38. The method of claim 33, further including integrating the semiconductor device into a package, the conductive layer being electrically connected to other components in the package.

39. The method of claim 33, further including forming an electrical connection between a second contact pad on the semiconductor die and the first contact pad on the substrate.

* * * * *